(12) United States Patent
Ivey

(10) Patent No.: US 10,356,936 B1
(45) Date of Patent: Jul. 16, 2019

(54) DIN RAIL ELECTRONICS RACK

(71) Applicant: Mitek Corp., Inc., Phoenix, AZ (US)

(72) Inventor: Johnathan Ivey, Chandler, AZ (US)

( * ) Notice: Subject to any disclaimer, the term of this patent is extended or adjusted under 35 U.S.C. 154(b) by 47 days.

(21) Appl. No.: 15/994,721

(22) Filed: May 31, 2018

(51) Int. Cl.
| | | |
|---|---|---|
| *H05K 7/14* | (2006.01) | |
| *H01R 25/14* | (2006.01) | |
| *H02B 1/052* | (2006.01) | |
| *H05K 7/18* | (2006.01) | |

(52) U.S. Cl.
CPC .............. *H05K 7/183* (2013.01); *H02B 1/052* (2013.01); *H05K 7/1489* (2013.01); *H01R 25/142* (2013.01); *H02B 1/0523* (2013.01)

(58) Field of Classification Search
CPC .... H02B 1/0523; H02B 1/052; H01R 9/2608; H01R 25/142; H01R 25/14; H05K 7/1474; H05K 7/12; H05K 7/183; H05K 7/1489
See application file for complete search history.

(56) References Cited

U.S. PATENT DOCUMENTS

| | | | | |
|---|---|---|---|---|
| 5,486,979 A | * | 1/1996 | Bowen ................... | H02B 1/052 200/296 |
| 7,374,453 B1 | * | 5/2008 | Allcock ................... | B66C 7/08 439/532 |
| 8,968,016 B1 | * | 3/2015 | Wu ......................... | H01R 25/14 439/214 |
| 2013/0208476 A1 | * | 8/2013 | Erhard .................... | F21V 17/16 362/249.02 |
| 2013/0316552 A1 | * | 11/2013 | Sasano ................. | H01R 9/2608 439/122 |
| 2013/0322044 A1 | * | 12/2013 | Kusumi ............... | H02B 1/0523 361/807 |
| 2014/0139976 A1 | * | 5/2014 | Santoni .................... | F16B 1/00 361/605 |
| 2018/0020564 A1 | * | 1/2018 | Kang ................... | H01R 9/2608 |

* cited by examiner

*Primary Examiner* — Abhishek M Rathod
(74) *Attorney, Agent, or Firm* — Keith L. Jenkins, Registered Patent Attorney, LLC; Keith L. Jenkins

(57) ABSTRACT

A DIN rail electronics rack having opposed sidewalls with modified "top hat" DIN rails attached therein and equipment attachment rails coupled to and lockable to the DIN rails, which are modified to have a linear array of equally spaced-apart openings aligned on each side of each DIN rail. The DIN rail coupling has a proximal flat surface to abut the equipment rail base panel, and distal opposed clamp ends to engage and retain the "brim" of the "top hat". A central distal plateau on the coupling includes two nut sockets shaped to prevent nuts from rotating while being threaded. The nut heads are configured to form three channels that align with any three adjacent DIN rail side openings. A three-toothed locking comb is inserted through the DIN rail side openings and three channels to lock the coupling to the DIN rail. A rack crown provides for lighting and fault services.

20 Claims, 11 Drawing Sheets

DIN RAIL ELECTRONICS RACK

FIELD OF ART

The present invention relates to racks for electronics equipment modules, such as standard 19-inch racks used in industry. The present invention more particularly relates to an electronics rack having equipment rails that are adjustably attached to DIN rails.

BACKGROUND OF THE INVENTION

DIN rails are standard rails used in the electronics business for supporting small snap-on electronics modules. "DIN" stands for Deutsches Institut Für Normung, a German institute that published the original standards. Several types of DIN rails are available including a "top hat" type of DIN rail. Equipment rails, by contrast, are operationally vertical strips of rigid material with a vertical liner array of fastener openings that are spaced-apart according to an electronic industry standard. Large electronics equipment modules, such as standard 19-inch modules, have short vertical linear arrays of fastener openings on opposing side flanges that are alignable to a corresponding short sequence of equipment rail fastener openings. Equipment rails are conventionally fixed in non-adjustable positions within the electronics rack, typically along opposing front sides and, optionally, along opposing rear sides.

SUMMARY OF THE INVENTION

A DIN rail electronics rack having opposed sidewalls with modified "top hat" DIN rails attached thereto and equipment attachment rails coupled to and lockable to the DIN rails, which are modified to have a linear array of equally spaced-apart openings aligned on each side of each DIN rail. The DIN rail coupling has a proximal flat surface to abut the equipment rail base panel, and distal opposed clamp ends to engage and retain the "brim" of the "top hat". A central distal plateau on the coupling includes two nut sockets shaped to prevent nuts from rotating while being threaded. The nut heads are configured to form three channels that align with any three adjacent DIN rail side openings. A three-toothed locking comb is inserted through the DIN rail side openings and three channels to lock the coupling to the DIN rail. A rack crown provides for lighting and fault services.

An embodiment of a DIN rail electronics rack including: first and second opposed spaced-apart parallel sidewalls; at least one connecting member between the first and second sidewalls; a first plurality of DIN rails in spaced-apart array attached to an interior side of the first sidewall; a second plurality of DIN rails in spaced-apart array attached to an interior side of the second sidewall; and where each the DIN rail of the first and second pluralities of DIN rails includes: a "top hat" type DIN rail; a first linear array of spaced-apart openings on a first side of the DIN rail; a second linear array of spaced-apart openings on a second side of the DIN rail, aligned and corresponding to the first linear array of spaced-apart openings; and a linear array of spaced-apart circular holes in the base of the DIN rail. That DIN rail electronics rack, including: at least two equipment rails, each further including: an elongated equipment rail base panel; and an elongated equipment rail attachment panel extending at right angle from a long edge of the equipment rail base panel; at least four DIN rail clamps each configured to be secured to the equipment rail base panel and to clamp onto any of the DIN rails of the first and second pluralities of DIN rails. That DIN rail electronics rack, where each the DIN rail clamp includes: a base having a flat under surface, an opposed upper surface, top and bottom opposed spaced-apart sides, and opposed spaced-apart left and right sides; first and second clamping flanges extending from the top and bottom sides, respectively; and a plateau extending from the base and having: left and right plateau sides continuous with the left and right sides of the base; top and bottom sides each spaced-apart from the first and second clamping flanges, respectively; first and second spaced-apart nut sockets in the plateau each including a shape to prevent rotation of a nut when the nut is being threaded during assembly; an upper surface of the plateau surrounding each of the first and second nut sockets; and first and second through bores through bottoms of respective first and second nut sockets, the plateau, and the base. That DIN rail electronics rack, including first and second nuts, each further including: a nut-socket-engaging portion configured to fill each nut socket of the first and second nut sockets; a panel extending from a top of the nut-socket-engaging portion including: top and bottom flanges including: lower surfaces that are configured to abut portions of the top surface of the plateau when installed; and left and right panel sides not extending over the upper surface of the plateau; and a thickness equal to a width of an opening of the first and second linear arrays of spaced-apart openings; a nut head extending from a top of the panel including: a left portion extending less than one-half of an extent of the spacing between the first and second nut sockets; and a right portion extending less than one-half of an extent of the spacing between the first and second spaced-apart nut sockets. That DIN rail electronics rack, includes: a locking comb having three teeth, each tooth having a cross section that fits slidingly into an opening of the first and second linear arrays of spaced-apart openings; and where: the first and second nut heads form three channels, when installed; the three channels are alignable to any three adjacent openings of the first and second linear arrays of spaced-apart openings; the locking comb is sized and shaped be inserted through any three adjacent openings of the first linear array of spaced-apart openings, then through the three channels, and then through three aligned adjacent openings of the second linear array of spaced-apart openings; and at least two teeth of the locking comb have a length to: extend outside of the DIN rail, when installed; and have fastener openings for securing the at least two teeth together. That DIN rail electronics rack, where the first plurality of DIN rails attached to the first sidewall are parallel and aligned one-to-one to the second plurality of DIN rails attached to the second sidewall. That DIN rail electronics rack, where: the first plurality of DIN rails in spaced-apart array welded to an interior surface of the first sidewall; and the second plurality of DIN rails in spaced-apart array welded to an interior surface of the second sidewall. That DIN rail electronics rack, including a rack crown further including: a main body configured to be attached to a top, and to a portion of the front, of the DIN rail electronics rack; first and second rear bodies: extending rearward from the main body from opposed ends of the main body; and attachable to a top frame of the DIN rail electronics rack; a removable top portion including a support for an illuminated logo panel; an electronics compartment; an electronics compartment cover; and a plurality of vents. That DIN rail electronics rack, where the rack crown includes logic circuitry, electronic connectability from the logic circuitry to a fault detection output on a rack mounted electronic module, and a light source responsive to the logic circuitry to illuminate when a fault is detected. That DIN rail electronics rack, including at least one front door sized to accommodate the rack crown. That DIN rail electronics rack, including a top panel of the DIN rail electronics rack having a plurality of knockouts and sized to accommodate the rack crown.

An embodiment of a DIN rail electronics rack including: first and second opposed spaced-apart parallel sidewalls; at least one DIN rail mounted on an interior side of at least one of the first and second sidewalls where each the DIN rail of the at least one DIN rail includes: a first linear array of spaced-apart openings on a first side of the DIN rail; a second linear array of spaced-apart openings on a second opposed side of the DIN rail, aligned and corresponding to the first linear array of spaced-apart openings. That DIN rail electronics rack, including: a first plurality of the DIN rails in spaced-apart array attached to an interior side of the first sidewall; a second plurality of the DIN rails in spaced-apart array attached to an interior side of the second sidewall; at least two equipment rails, each further including: an elongated equipment rail base panel; and an elongated equipment rail attachment panel extending at right angle from a long edge of the equipment rail base panel; at least four DIN rail clamps each configured to: be secured to the equipment rail base panel; and clamp onto any of the DIN rails of the first and second pluralities of DIN rails. That DIN rail electronics rack, where each DIN rail clamp includes: a base having a flat under surface, an opposed upper surface, top and bottom opposed spaced-apart sides, and opposed spaced-apart left and right sides; first and second clamping flanges extending from the top and bottom sides, respectively; and a plateau extending from the base and having: left and right plateau sides continuous with the left and right sides of the base; top and bottom sides each spaced-apart from the first and second clamping flanges, respectively; first and second spaced-apart nut sockets in the plateau each including a shape to prevent rotation of a nut when the nut is being threaded during assembly; an upper surface of the plateau surrounding each the nut socket of the first and second nut sockets; and first and second through bores through bottoms of respective the first and second nut sockets, the plateau, and the base. first and second nuts, each further including: a nut-socket-engaging portion configured to fill one the nut socket of the first and second nut sockets; a panel extending from a top of the socket-engaging portion including: top and bottom flanges including: lower surfaces that are configured to abut portions of the top surface of the plateau when installed; and left and right panel sides spaced-apart from the left and right plateau sides; and a thickness equal to a width of an opening of the first and second linear arrays of spaced-apart openings; a nut head extending from a top of the panel including: a left portion extending less than one-half of a spacing of the first and second nut sockets; and a right portion extending less than one-half of an extent of a spacing of the first and second spaced-apart nut sockets. a locking comb having three teeth, each tooth having a cross section that fits slidingly into an opening of the first and second linear arrays of spaced-apart openings; and where: the first and second nut heads form three channels, when installed; the three channels are alignable to any three adjacent openings of the first and second linear arrays of spaced-apart openings; the locking comb is sized and shaped be inserted through any three adjacent openings of the first linear array of spaced-apart openings, then through the three channels, and then through three aligned adjacent openings of the second linear array of spaced-apart openings; and at least two teeth of the locking comb have a length to: extend outside of the DIN rail, when installed; and have fastener openings for securing the at least two teeth together outside of the DIN rail. That DIN rail electronics rack, including a rack crown further including: a main body configured to be attached to a top, and to a portion of the front, of the DIN rail electronics rack; first and second rear bodies: extending rearward from the main body from opposed ends of the main body; and attachable to a top frame of the DIN rail electronics rack; a removable top portion including a support for an illuminated acrylic logo panel; an electronics compartment cover; a plurality of vents; logic circuitry; communication between the logic circuitry and a fault detection output on a rack mounted electronic module; and a light source responsive to the logic circuitry to illuminate when a fault is detected. That DIN rail electronics rack, including at least two of: at least one front door sized to accommodate the rack crown; at least one rear door; and a top panel of the DIN rail electronics rack having a plurality of knockouts and sized to accommodate the rack crown.

An embodiment of a DIN rail electronics rack including: an electronics rack having a sidewall; a DIN rail attached to the sidewall; a DIN rail clamp: adapted to clamp resiliently onto the DIN rail; and attached to an equipment attachment rail; and where the DIN rail includes: a "top hat" type DIN rail; a first linear array of spaced-apart openings on a first side of the DIN rail; a second linear array of spaced-apart openings on a second side of the DIN rail, aligned and corresponding to the first linear array of spaced-apart openings; and weldable areas on a base of the DIN rail. That DIN rail electronics rack, including: a first plurality of the DIN rails in spaced-apart array attached to an interior side of the first sidewall; a second plurality of the DIN rails in spaced-apart array attached to an interior side of the second sidewall; at least two equipment rails, each further including: an elongated equipment rail base panel; and an elongated equipment rail attachment panel extending at right angle from a long edge of the equipment rail base panel; at least four DIN rail clamps each configured to: be secured to the equipment rail base panel; and clamp onto any of the DIN rails of the first and second pluralities of DIN rails. That DIN rail electronics rack, where each DIN rail clamp includes: a base having a flat under surface, an opposed upper surface, top and bottom opposed spaced-apart sides, and opposed spaced-apart left and right sides; first and second clamping flanges extending from the top and bottom sides, respectively; and a plateau extending from the base and having: left and right plateau sides continuous with the left and right sides of the base; top and bottom sides each spaced-apart from the first and second clamping flanges, respectively; first and second spaced-apart nut sockets in the plateau each including a shape to prevent rotation of a nut when the nut is being threaded during assembly; an upper surface of the plateau surrounding each the nut socket of the first and second nut sockets; and first and second through bores through bottoms of respective the first and second nut sockets, the plateau, and the base; first and second nuts, each further including: a nut-socket-engaging portion configured to fill one the nut socket of the first and second nut sockets; a panel extending from a top of the nut-socket-engaging portion including: top and bottom flanges including: lower surfaces that are configured to abut portions of the top surface of the plateau when installed; and left and right panel sides spaced-apart from the left and right plateau sides; and a thickness equal to a width of an opening of the first and second linear arrays of spaced-apart rectangular openings; a nut head extending from a top of the panel including: a left portion extending less than one-half of the spacing between the first and second nut sockets; and a right portion extending less than one-half of an extent of the spacing of the first and second spaced-apart nut sockets. a locking comb having three teeth, each tooth having a cross section that fits slidingly into an opening of the first and second linear arrays of spaced-apart openings; and where: the first and second nut heads form three channels, when installed; the three channels are alignable to any three adjacent openings of the first and second linear arrays of spaced-apart openings; the locking comb is sized and shaped be inserted through any three adjacent openings of the first linear array of spaced-apart openings, then through the three channels, and then through three aligned adjacent openings of the second linear array of spaced-apart openings; and at least two teeth of the locking comb have a length to: extend outside of the DIN rail, when installed; and have fastener openings for securing the at least two teeth together. That DIN rail electronics rack, including a rack crown further including: a main body configured to be attached to a top, and to a portion of the front, of the DIN rail electronics rack; first and second rear bodies: extending rearward from the main body from opposed ends of the main body; and attachable to a top frame of the DIN rail electronics rack; a removable top portion including a support for an illuminated logo panel; an electronics compartment; and electronics compartment cover; a plurality of vents; logic circuitry; communication between the logic circuitry and a fault detection output on a rack mounted electronic module; and a light source responsive to the logic circuitry to illuminate when a fault is detected.

DESCRIPTION OF THE FIGURES OF THE DRAWINGS

The present invention will hereinafter be described in conjunction with the following drawing figures, wherein like numerals denote like elements.

DETAILED DESCRIPTION OF THE INVENTION

As used and defined herein, "left," "right," "top," "bottom," and other directional references are referenced to the operational position of the device and from the point of view of the observer of the associated drawing.

Figure 1:
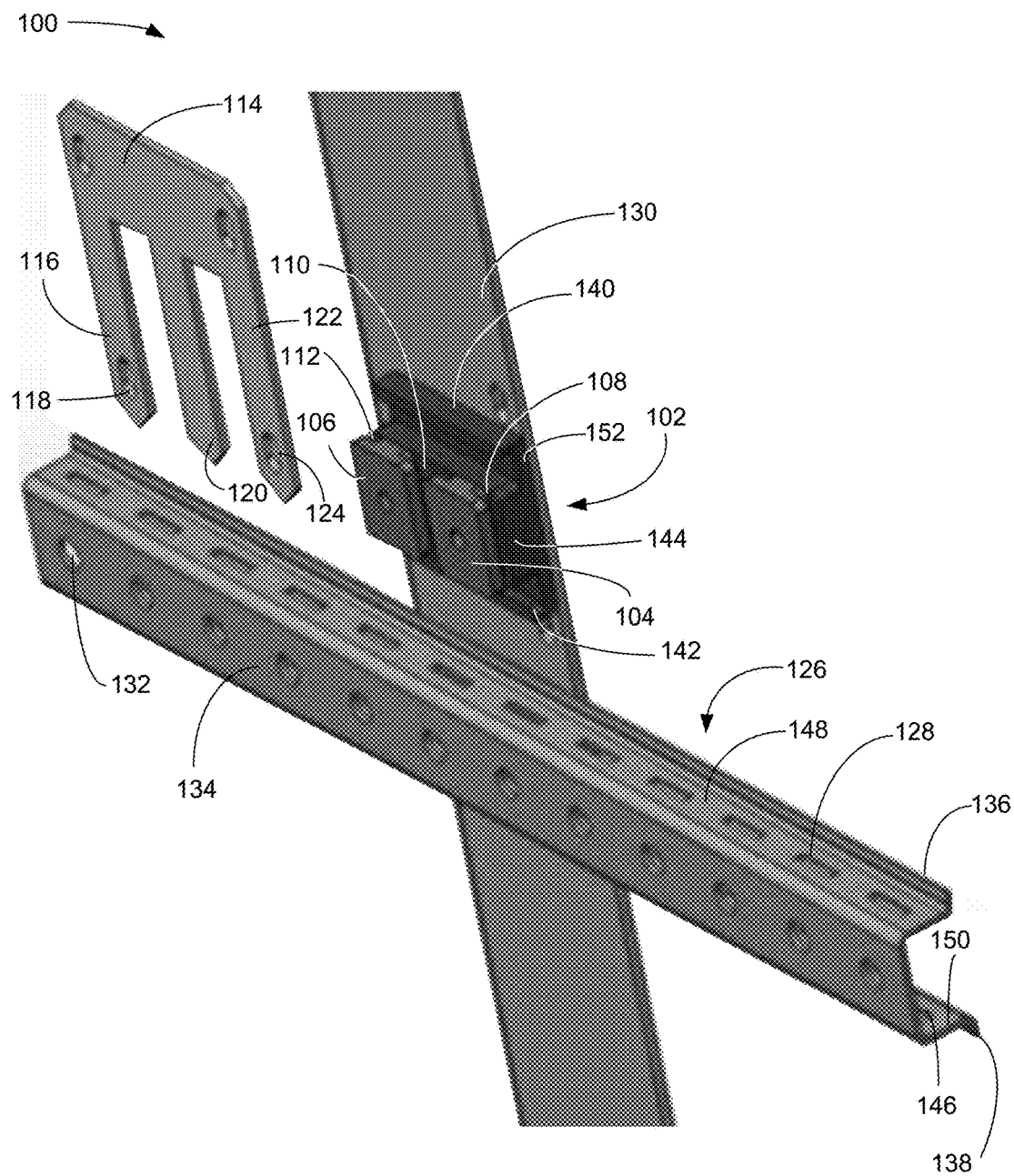
FIG. 1 is an exploded perspective plan view illustrating an exemplary embodiment of a DIN rail clamp for an assembly of a DIN rail electronics rack of FIG. 8, according to a preferred embodiment of the present invention.
Figure 8:
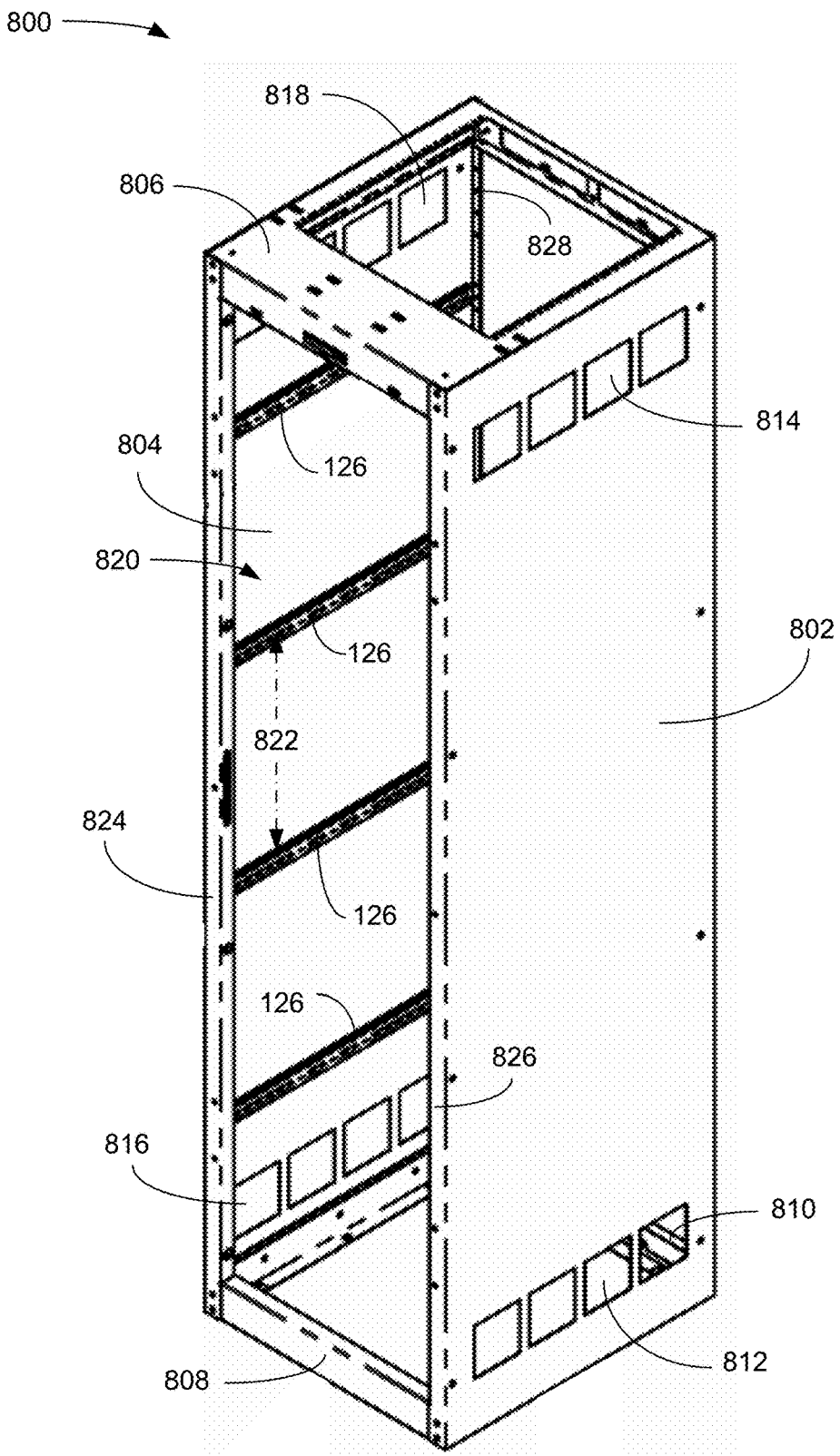
FIG. 8 is a perspective view illustrating an exemplary embodiment of a DIN rail electronics rack, according to a preferred embodiment of the present invention.

FIG. 1 is an exploded perspective plan view illustrating an exemplary embodiment of a DIN rail clamp 102 for an assembly 100 of a DIN rail electronics rack 800 of FIG. 8, according to a preferred embodiment of the present invention. DIN rail 126 is of the "top hat" variety. While the "top hat" variety of DIN rail 126 is illustrated throughout, other types of DIN rails may also suffice. Uniquely, DIN rail 126 has top rectangular openings 128 (one of twelve labeled) through a top side 148 of DIN rail 126 and bottom openings 146 (one of twelve labeled) through a bottom side 150 of DIN rail 126, all in aligned linear arrays with rectangle centers spaced one inch apart. Fastener openings 132 (one of twelve labeled) on the left side of the base 134 (the "top" of the "top hat") are circular, rather than the standard slots, to provide additional surface space for welding DIN rails 126 onto interior surfaces of sidewalls 802 and 804 of the DIN rail electronics rack 800 (see FIG. 8). In some embodiments, the openings 128 may not be rectangular. As will be described in more detail below, the openings must be the same on the top side 148 as the bottom side 150 and must correspond in shape and spacing to channels 108, 110, and 112. The DIN rail 126, as illustrated, is a short portion of a DIN rail 126 used in the DIN rail electronics rack 800.

DIN rail clamp base 152 has opposed top and bottom clamp flanges 140 and 142, respectively, which may resiliently snap onto top and bottom DIN rail flanges 136 and 138 (the "brim" of the "top hat"), respectively. A plateau 144 in the middle of the DIN rail clamp base 152 has two nut sockets 408 and 412 (see FIG. 4) that receive nuts 106 and 104, respectively. The nuts 106 and 104 have uniquely shaped heads which create channels 108, 110, and 112, which are alignable to any three adjacent top rectangular openings 128 and corresponding three adjacent bottom rectangular openings 146 when the DIN rail 126 is mounted on the DIN rail clamp 102.

Locking comb 114 has three teeth 116, 120, and 122, each tooth having a cross-sectional shape like openings 128, 146, and channels 108, 110, and 112, spaced-apart on one-inch centers, and sized to fit slidingly through three adjacent top openings 128, three aligned nut head channels 108, 110, and 112, respectively, and three aligned adjacent bottom openings 146 to prevent movement of the DIN rail clamp 102. Opening 118 in tooth 116 and opening 124 in tooth 122 may be connected with a bundle tie, or similarly functional device, to resist removal of the locking comb 114.

DIN rail clamp 102 is attached to equipment rail base panel 130 using machine screws 620 and 626 (see FIG. 6), as will be described in more detail below. Equipment rail panel 130 is of one piece and at a right angle with equipment rail attachment panel 702 (see FIG. 7A), which is not visible in this view.

Figure 2:
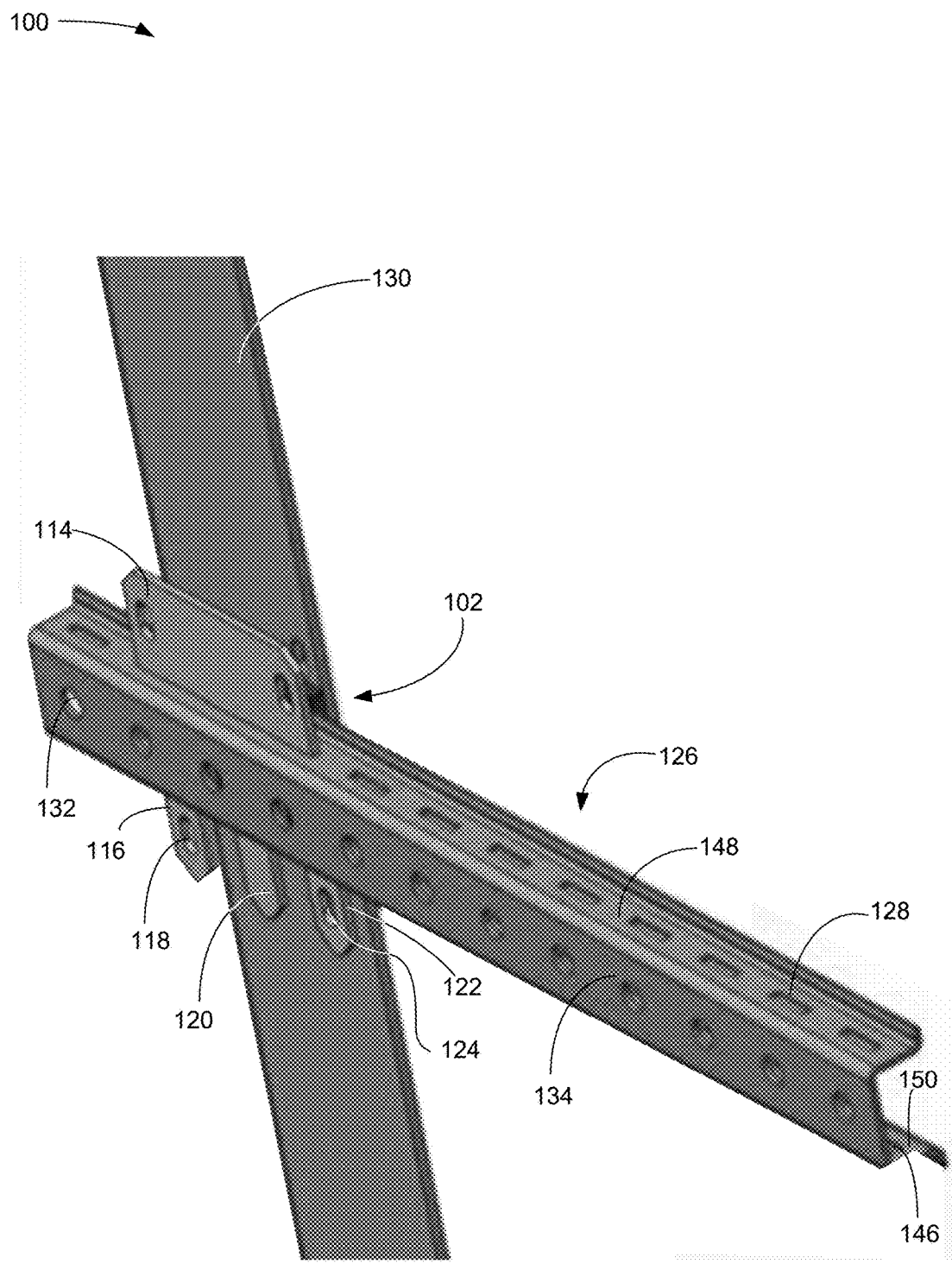
FIG. 2 is a perspective view illustrating an exemplary embodiment of the DIN rail clamp for an assembly of FIG. 1 for a DIN rail electronics rack of FIG. 8, according to a preferred embodiment of the present invention.

FIG. 2 is a perspective view illustrating an exemplary embodiment of the DIN rail clamp 102 of FIG. 1 for an assembly 100 for a DIN rail electronics rack 800 of FIG. 8, according to a preferred embodiment of the present invention. The DIN rail clamp 102 is clamped onto DIN rail 126 and locking comb 114 has been inserted through three adjacent top rectangular openings 128, three aligned nut head channels 108, 110, and 112, respectively, and three aligned adjacent bottom rectangular openings 146. Equipment rail base panel 130 can be attached to and locked to the DIN rail 126 at any point where three adjacent top openings 128 are available.

Figure 3:
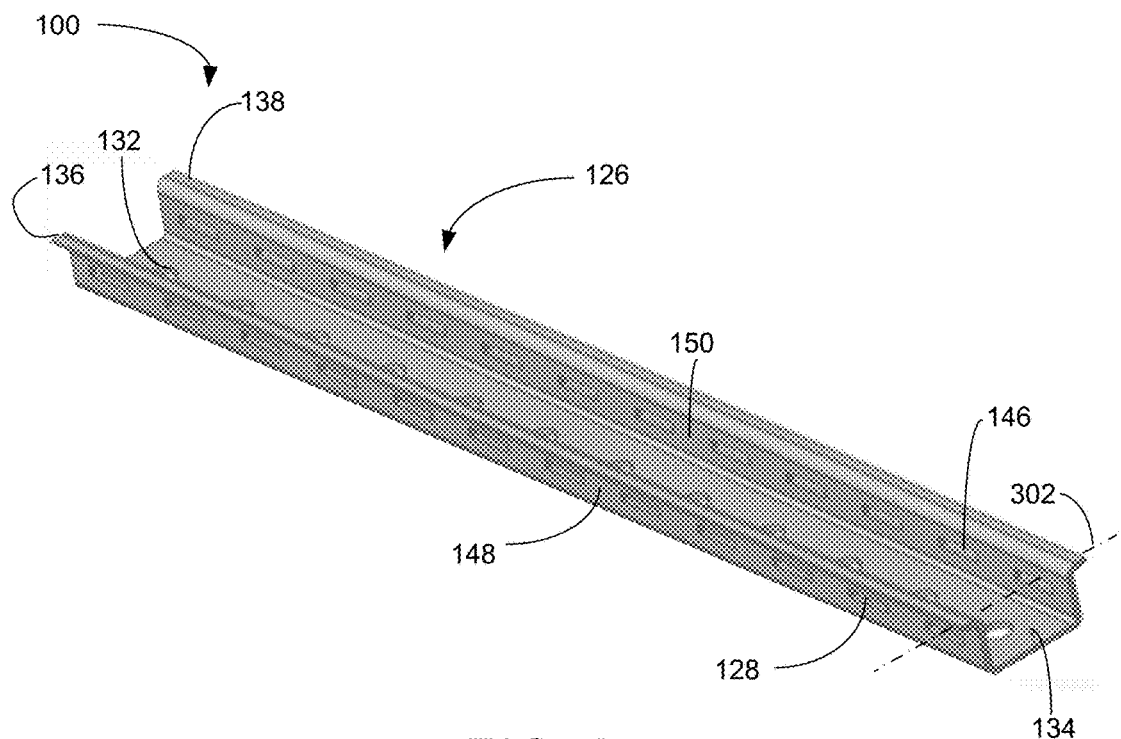
FIG. 3 is a perspective view illustrating an exemplary embodiment of a "top hat" DIN rail of FIG. 1 of the DIN rail electronics rack of FIG. 8, according to a preferred embodiment of the present invention.

FIG. 3 is a perspective view illustrating an exemplary embodiment of a "top hat" DIN rail 126 of FIG. 1 of the DIN rail electronics rack 800 of FIG. 8, according to a preferred embodiment of the present invention. The alignment 302 of top rectangular openings 128 to bottom rectangular openings 146 can be clearly seen in this view. The cross-sectional shape of the DIN rail 126 preferably conforms to international standards.

Figure 4:
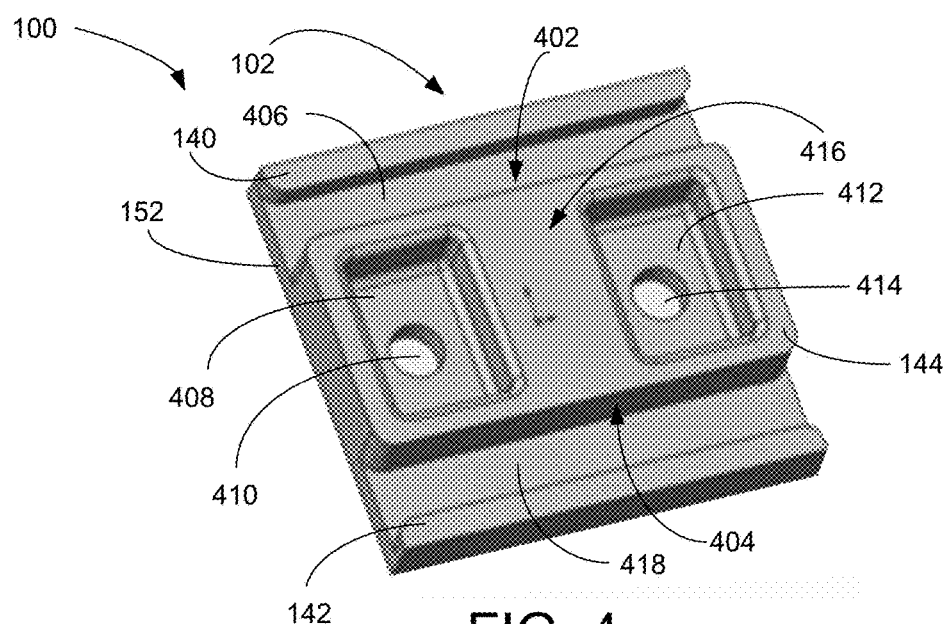
FIG. 4 is a perspective view illustrating an exemplary embodiment of the DIN rail clamp base of FIG. 1 of the DIN rail electronics rack of FIG. 8, according to a preferred embodiment of the present invention.

FIG. 4 is a perspective view illustrating an exemplary embodiment of the DIN rail clamp base 152 of FIG. 1 of the DIN rail electronics rack 800 of FIG. 8, according to a preferred embodiment of the present invention. Plateau 144 extends orthogonally from DIN rail clamp base 152 between and spaced-apart from DIN rail clamp flanges 140 and 142, which also extend from DIN rail clamp base 152. Plateau 144 has a top side 402 spaced apart from DIN rail clamp flange 140 creating a sideways channel 406 for receiving DIN rail flange 136. Plateau 144 also has a bottom side 404 spaced apart from DIN rail flange 142 to create sideways channel 418.

Nut sockets 408 and 412, with respective through bore fastener openings 410 and 414 in plateau 144, receive nuts 104 and 106, respectively, as shown in FIG. 1. Nut sockets 408 and 412 prevent nuts 104 and 106 from rotating when being threaded by machine screws 626 and 620 (see FIG. 6), respectively. Plateau 144 has a front surface 416 that surrounds nut sockets 408 and 412.

Those of skill in the art, enlightened by the present disclosure, will understand the wide variety of shapes that may be used for nut sockets 408 and 412 to prevent nuts 104 and 106 of corresponding shapes from rotating, all of which are within the scope of the present invention. Rectangular nut sockets 408 and 412 and nuts 104 and 106 are preferably rectangular due to simplicity of manufacture.

Figure 5:
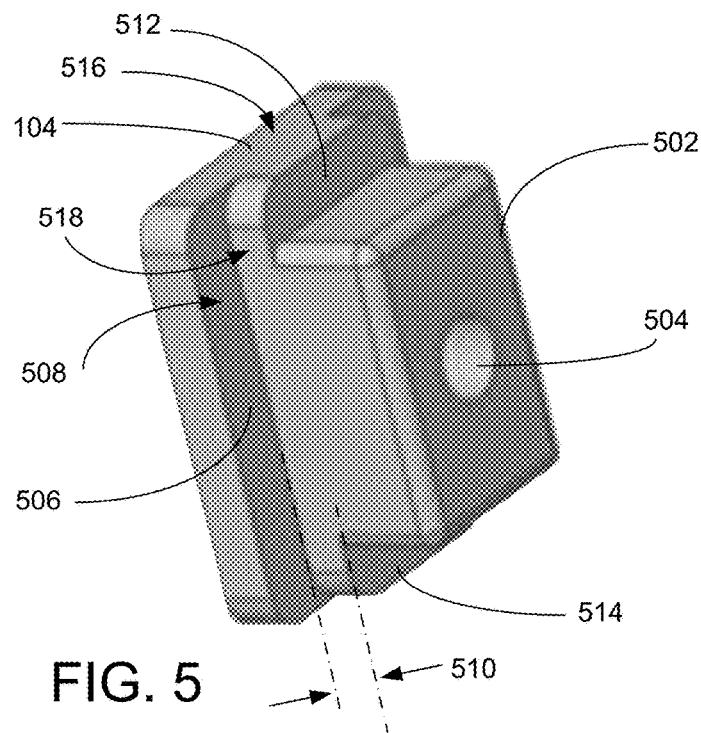
FIG. 5 is a perspective view illustrating an exemplary embodiment of the DIN rail clamp nut of FIG. 1 of the DIN rail electronics rack of FIG. 8, according to a preferred embodiment of the present invention.

FIG. 5 is a perspective view illustrating an exemplary embodiment of the DIN rail clamp nut 104 of FIG. 1 of the DIN rail electronics rack 800 of FIG. 8, according to a preferred embodiment of the present invention. Rectangular nut 104 has a socket-engaging portion 502 that fills nut socket 412 and from which top and bottom flanges 512 and 514, respectively, extend in order to rest on portions of the top surface 416 of plateau 144, when installed. Top and bottom flanges 512 and 514, respectively, have a thickness 510 that extends, when installed, above the front surface 416 of the plateau 144 and to a rear surface 508 of nut head 506. Front surface 416 of plateau 144, side surfaces 518 (one of two visible and labeled) of top and bottom flanges 512 and 514, and nut head 506 rear surface 508 create channel 108 and one half of channel 110, when nut 104 is installed. Nut head top surface 516 is preferably configured to be flush with a top side surface 402 of plateau 144. Through bore 504 is threaded. Rectangular nut 106 is similarly configured.

Figure 6:
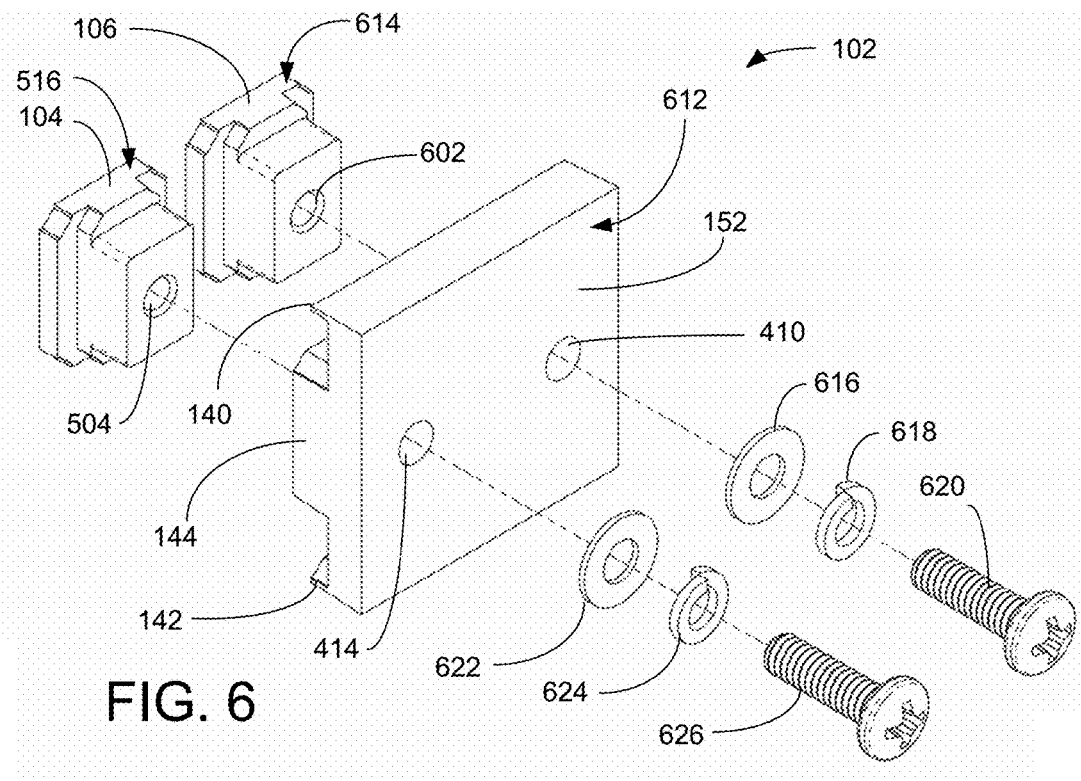
FIG. 6 is an exploded perspective view illustrating an exemplary embodiment of the entire DIN rail clamp of FIG. 1 of the DIN rail electronics rack of FIG. 8, according to a preferred embodiment of the present invention.

FIG. 6 is an exploded perspective view illustrating an exemplary embodiment of the entire DIN rail clamp 102 of FIG. 1 of the DIN rail electronics rack 800 of FIG. 8, according to a preferred embodiment of the present invention. Rectangular nuts 104 and 106 are aligned to respective nut sockets 412 and 408 with respective threaded bores 505 and 602 aligned to respective through bores 414 and 410. Nut 106 has a top surface 614 that will be flush with a top side 402 of the plateau 144. Washer 622, lock washer 624, and machine screw 626 are aligned to through bore 414. Washer 616, lock washer 618, and machine screw 620 are aligned to through bore 410. In the DIN rail electronics rack 800, equipment rail base panel 130 abuts back surface 612 of DIN rail clamp base 152, and receives machine screws 626 and 620 with respective washers 622 and 616 and with lock washers 624 and 618, respectively. In various other embodiments, other shapes of nut sockets 408 and 412, with corresponding shapes of nuts 104 and 106, may be used, within the constraints of: having nut heads 506 that assist in forming locking channels, such as 108, 110, and 112; and constraining nuts 104 and 106 from rotating while being threaded with machine screws 626 and 620, respectively.

Figure 7A:
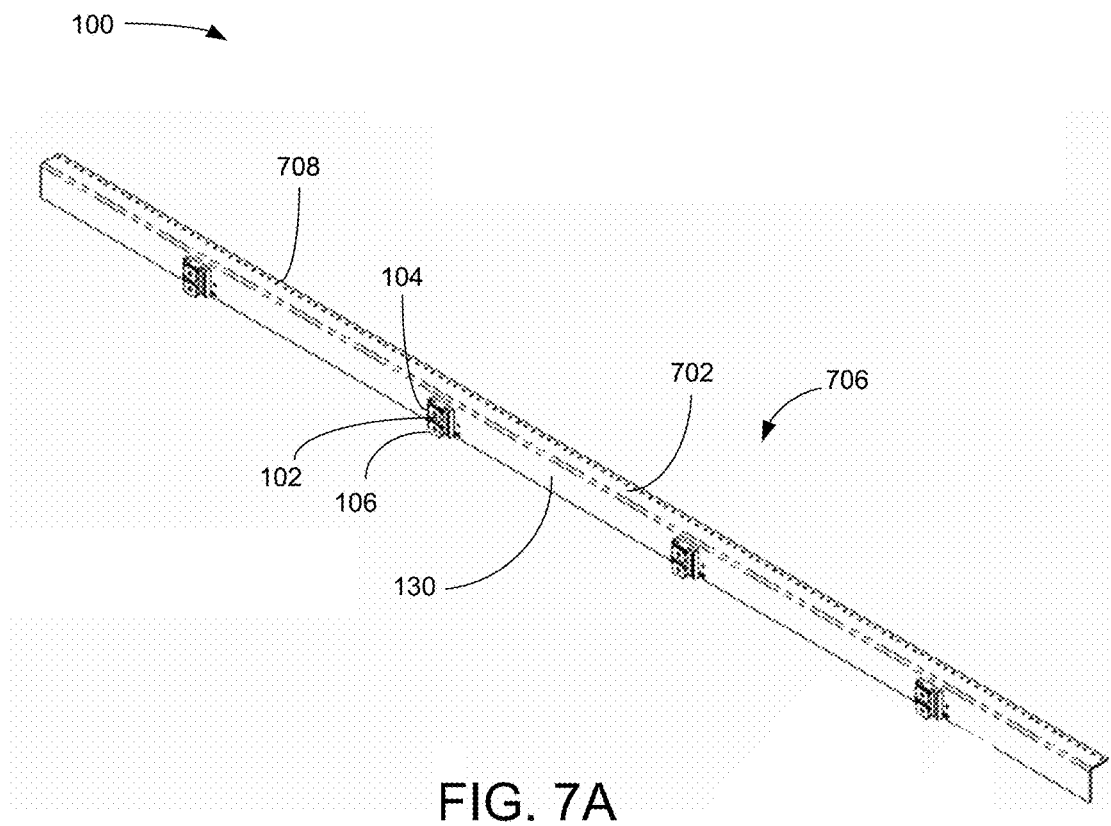
FIG. 7A is a perspective view illustrating an exemplary embodiment of an equipment rail, with DIN rail clamps attached, of the DIN rail electronics rack of FIG. 8, according to a preferred embodiment of the present invention.

FIG. 7A is a perspective view illustrating an exemplary embodiment of an equipment rail 706, with DIN rail clamps 102 attached, of the DIN rail electronics rack 800 of FIG. 8, according to a preferred embodiment of the present invention. Equipment rail 706 includes equipment rail base panel 130 at right angles to equipment rail attachment panel 702. Equipment rail base panel 130 and equipment rail attachment panel 702 are preferably of one piece. Equipment rail attachment panel 702 has a linear array of spaced-apart fastener holes 708 for fastening electronic equipment modules, such as nineteen-inch equipment modules 1306, 1308, 1310, and 1316 (see FIG. 13), to equipment rail 706. DIN rail clamps 102 (one of four labeled) are attached to equipment rail base panel 130, as shown, and are spaced-apart with a spacing corresponding to the spacing of DIN rails 126 in the DIN rail electronics rack 800 (see FIG. 8). In various embodiments, there may be more or fewer DIN rail clamps 102 attached to equipment rail 706, corresponding to the DIN rails 126 in the DIN rail electronics rack 800 (see FIG. 8).

Figure 7B:
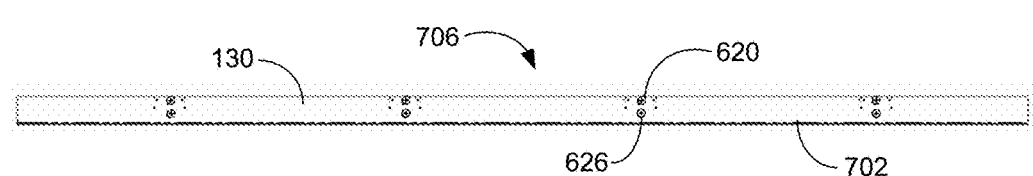
FIG. 7B is a right-hand side elevation view illustrating the exemplary embodiment of the equipment rail of FIG. 7A of the DIN rail electronics rack of FIG. 8, according to a preferred embodiment of the present invention.

FIG. 7B is a right-hand side elevation view illustrating the exemplary embodiment of the equipment rail 706 of FIG. 7A of the DIN rail electronics rack 800 of FIG. 8, according to a preferred embodiment of the present invention. While shown in a horizontal position for economy of the drawing, the operational orientation of equipment rail 706 is conventionally vertical. Machine screws 620 (one of four labeled) and 626 (one of four labeled) are visible on the interior side of equipment rail base panel 130.

Figure 7C:
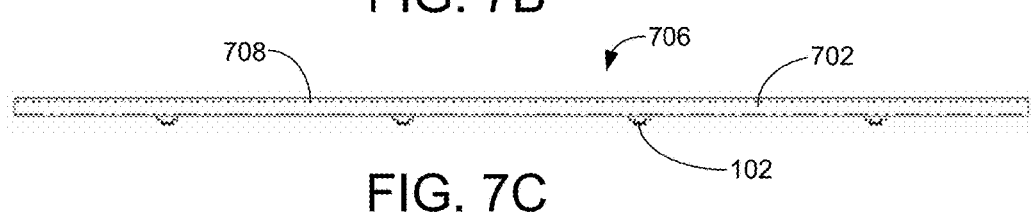
FIG. 7C is a front elevation view illustrating the exemplary embodiment of the equipment rail of FIG. 7A of the DIN rail electronics rack of FIG. 8, according to a preferred embodiment of the present invention.

FIG. 7C is a front elevation view illustrating the exemplary embodiment of the equipment rail 706 of FIG. 7A of the DIN rail electronics rack 800 of FIG. 8, according to a preferred embodiment of the present invention. Exemplary relative dimensions of the equipment rail attachment panel 702 and the DIN rail clamps 102 can be seen in this view.

Figure 7D:
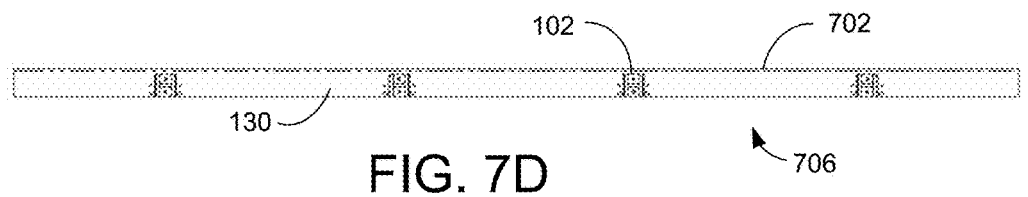
FIG. 7D is a left-hand side elevation view illustrating the exemplary embodiment of the equipment rail of FIG. 7A of the DIN rail electronics rack of FIG. 8, according to a preferred embodiment of the present invention.

FIG. 7D is a left-hand side elevation view illustrating the exemplary embodiment of the equipment rail 706 of FIG. 7A of the DIN rail electronics rack 800 of FIG. 8, according to a preferred embodiment of the present invention. The junction of equipment rail base panel 130 and equipment rail attachment panel 702 is curved, as shown. In another embodiment, the junction may lack curvature.

FIG. 8 is a perspective view illustrating an exemplary embodiment of a DIN rail electronics rack 800, according to a preferred embodiment of the present invention. DIN rail electronics rack 800 is shown in its basic structure, without installed equipment 1306, 1308, 1310, 1312, 1314, and 1316 (see FIG. 13); doors 1218 and 1220, top panel 1226 or rack crown 1202 (see FIG. 12). DIN rail electronics rack 800 has opposed spaced-apart parallel sidewalls 802 and 804 connected at the top by top rack frame 806 and at the bottom by other cross members 808 and 810. DIN rails 126 attached to sidewall 804 are preferably equally spaced-apart 822 and are parallel and aligned one-to-one to a second plurality of DIN rails attached to sidewall 802.

DIN rails 126 are shown attached to an interior surface 820 of left sidewall 804. The interior surface of right sidewall 802 is similarly arrayed with DIN rails 126. DIN rails 126 are preferably attached to DIN rail electronics rack 800 by welding. In other embodiments, other means of attaching DIN rails 126 may be used. Preferably, the DIN rails 126 on the right side are parallel and opposed so that one design of equipment rail 706 may suffice, as equipment rails 706 may be used right-side-up on the left side or upside-down on the right side if the spacing 822 between DIN rails 126 is equal between all DIN rails 126. In an unusual embodiment, DIN rails 126 on the right side may not align to DIN rails 126 on the left side. In another embodiment, an additional complete or partial DIN rail 126 that is only used for traditional snap-on components 1318 and 1326 (see FIG. 13) may be attached to either side of the DIN rail electronics rack 800 and not be involved in supporting equipment rails 706.

Right sidewall 802 has top ventilation openings 814 (one of four labeled) and bottom ventilation openings 812 (one of four labeled). Right sidewall 802 has front and rear twice folded edges 826 (one partial of two labeled) for improved rigidity of the DIN rail electronics rack 800. Left sidewall 804 has top ventilation openings 818 (one of four labeled) and bottom ventilation openings 816 (one of four labeled). Left sidewall 804 has front and rear twice folded edges 824 and 828 for improved rigidity of the DIN rail electronics rack 800. Top rack frame 806 connects left sidewall 804 to right sidewall 802 at the front and rear and provides improved rigidity along top edges of the left sidewall 804 to right sidewall 802. Front bottom cross member 808 connects left sidewall 804 to right sidewall 802 and rear bottom cross member 810 connects left sidewall 804 to right sidewall 802.

Figure 9:
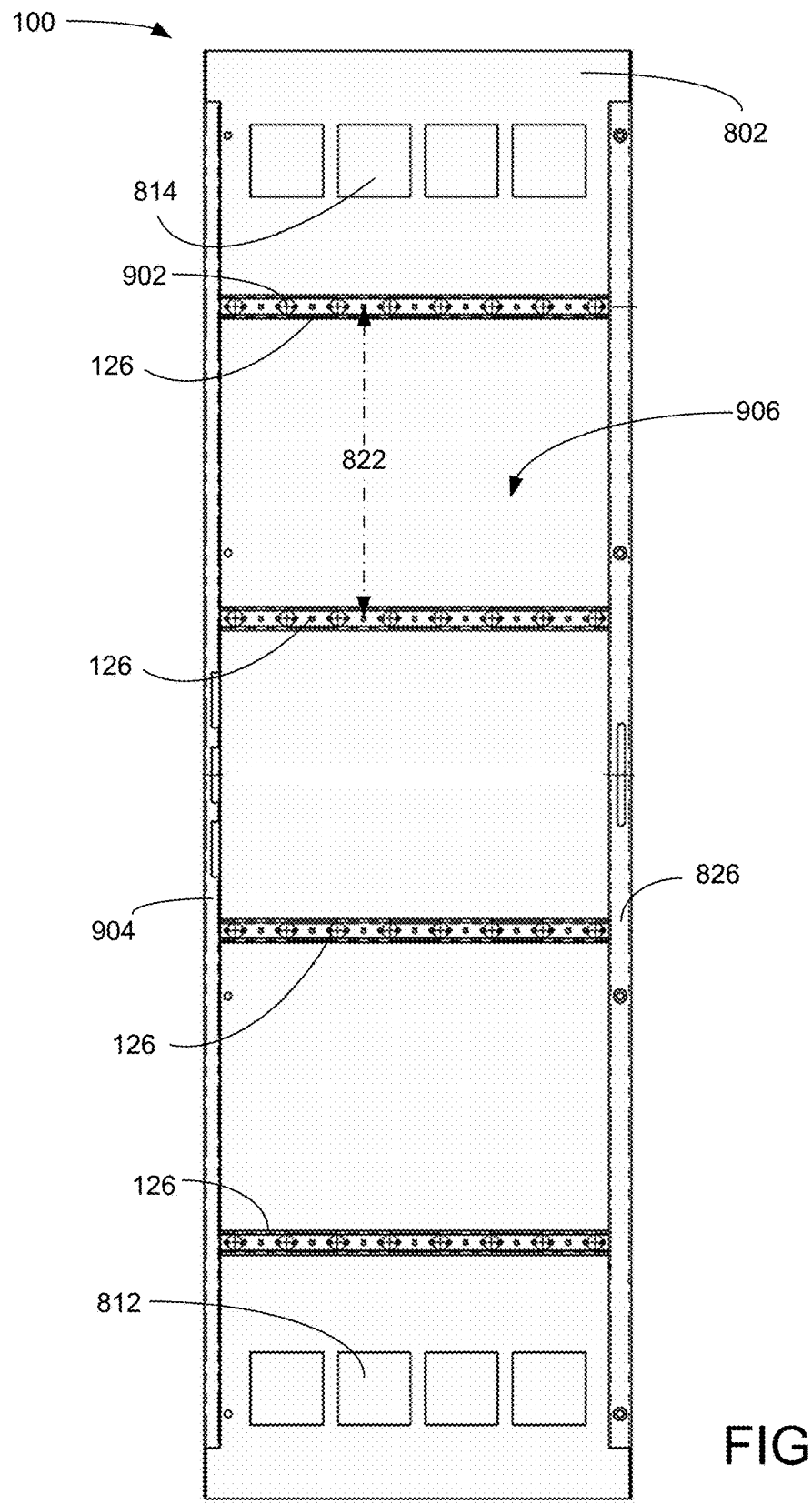
FIG. 9 is an interior side elevation view illustrating the exemplary embodiment of a DIN rail electronics rack of FIG. 8, according to a preferred embodiment of the present invention.

FIG. 9 is an interior side elevation view illustrating the exemplary embodiment of a DIN rail electronics rack 800 of FIG. 8, according to a preferred embodiment of the present invention. The interior surface 906 of right sidewall 802 is shown with DIN rails 126 attached and welding points 902 (one of thirty-two labeled) indicated. Twice folded rear edge 904 can be seen in this view.

Figure 10:
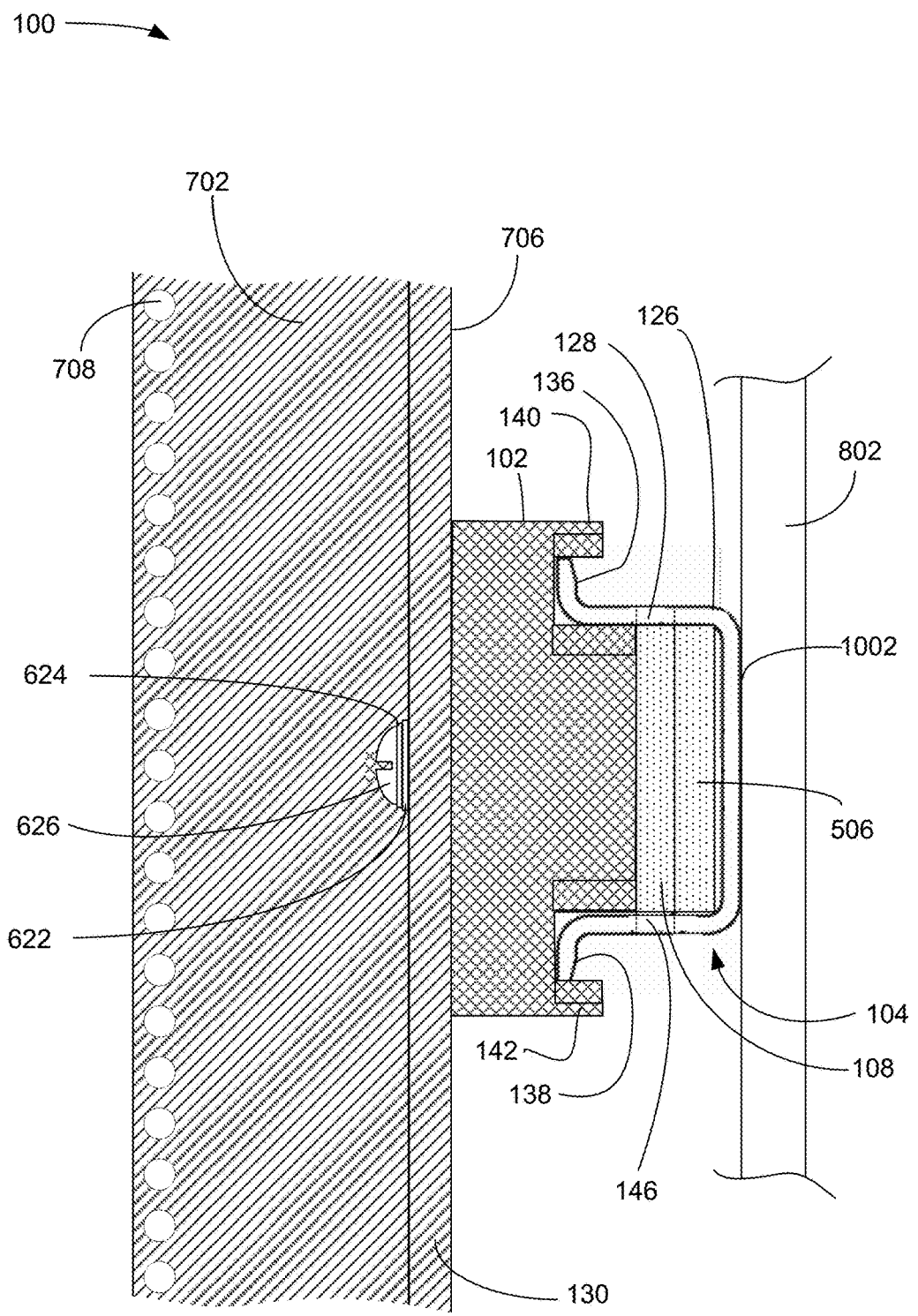
FIG. 10 is a side elevation view illustrating the exemplary embodiment of the DIN rail clamp of FIG. 1 installed on an equipment rail of FIG. 1 of the DIN rail electronics rack of FIG. 8, according to a preferred embodiment of the present invention.

FIG. 10 is a side elevation view illustrating the exemplary embodiment of the DIN rail clamp 102 of FIG. 1 installed on an equipment rail 706 of FIG. 1 of the DIN rail electronics rack 800 of FIG. 8, according to a preferred embodiment of the present invention. Machine screw 626, along with washer 622 and lock washer 624, is shown fastening DIN rail clamp 102 to the equipment rail base panel 130 of equipment rail 706. DIN rail 126 is welded 1002 to right sidewall 802 of DIN rail electronics rack 800. Channel 108 is aligned to top rectangular opening 128 of DIN rail 126 and bottom rectangular opening 146 of DIN rail 126. Nut head 506 is shown inserted into DIN rail 126 and top and bottom DIN rail clamp flanges 140 and 142, respectively, engage and retain respective top and bottom DIN rail flanges 136 and 138. Thus, the equipment rail 706 is coupled to the DIN rail 126 which is coupled to sidewall 802.

Figure 11:
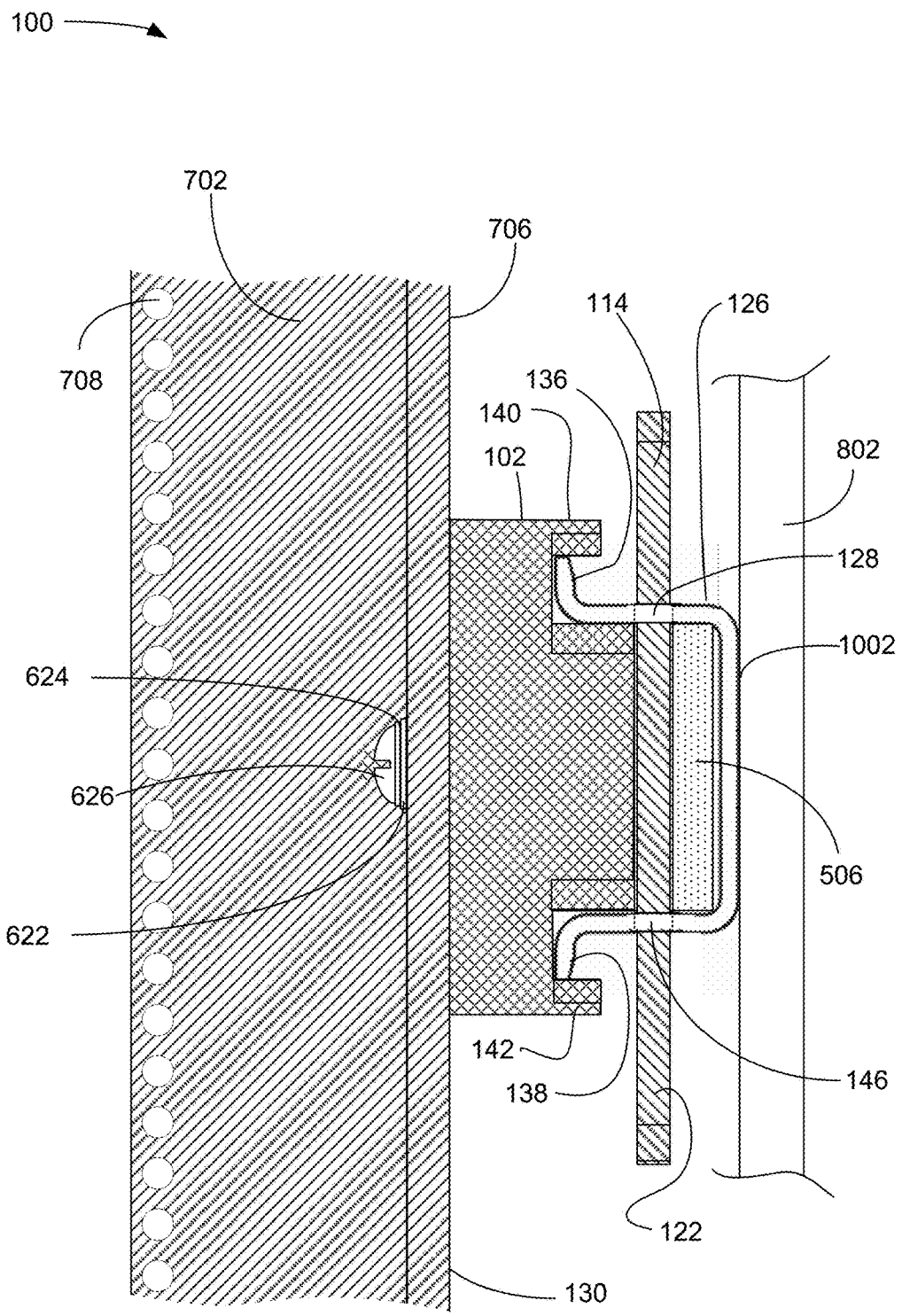
FIG. 11 is a side elevation view illustrating the exemplary embodiment of the DIN rail clamp of FIG. 1 locked on an equipment rail of FIG. 1 of the DIN rail electronics rack of FIG. 8, according to a preferred embodiment of the present invention.

FIG. 11 is a side elevation view illustrating the exemplary embodiment of the DIN rail clamp 102 of FIG. 1 locked on an equipment rail 706 of FIG. 1 of the DIN rail electronics rack 800 of FIG. 8, according to a preferred embodiment of the present invention. Locking comb 114 is installed with tooth 122 inserted through top rectangular opening 128, channel 108, and bottom rectangular opening 146, preventing equipment rail 706 from detaching from DIN rail 126. Teeth 118 and 120 (not visible in this view) are similarly disposed through channels 112 and 110, respectively.

Figure 12:
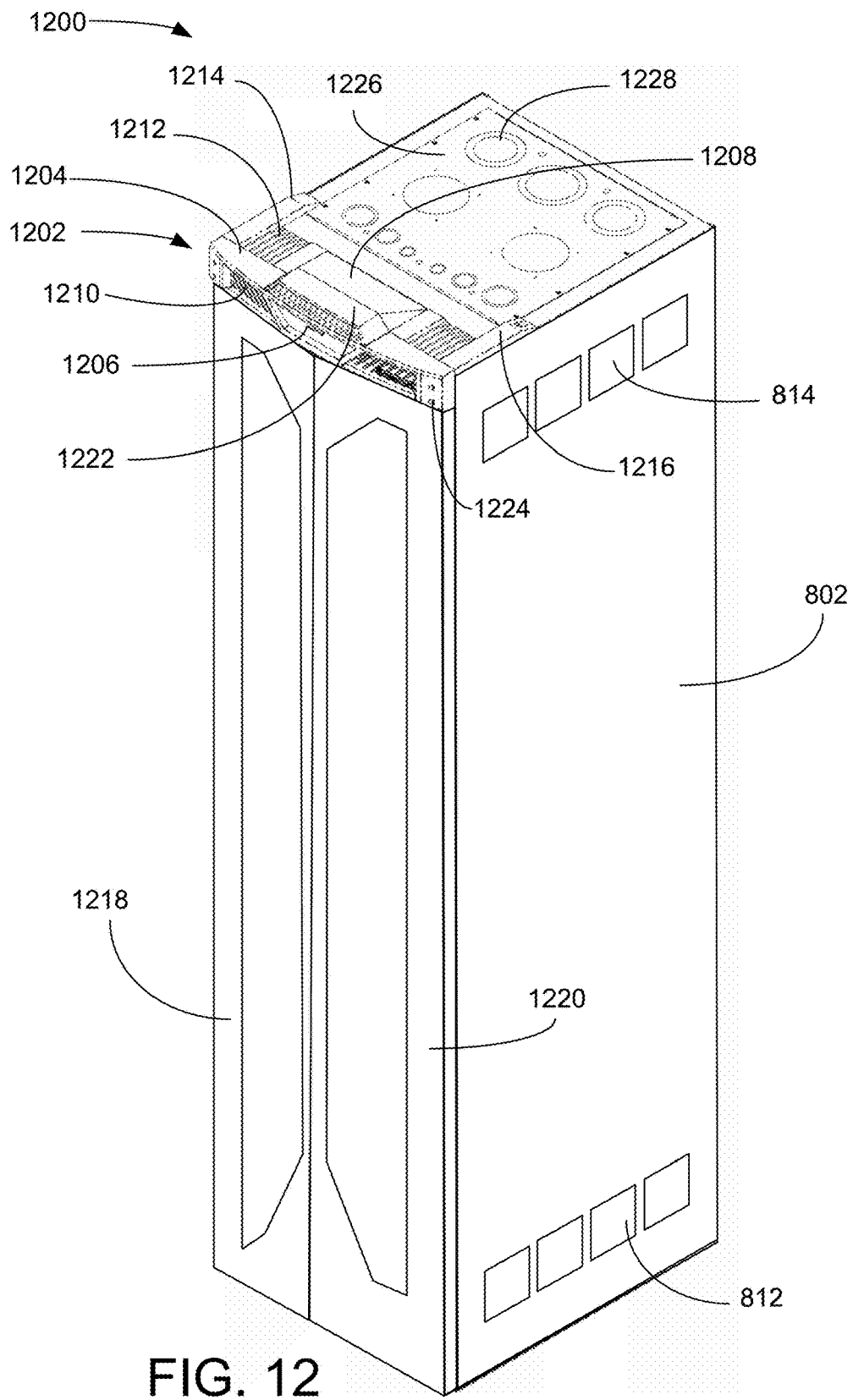
FIG. 12 is a perspective view illustrating the exemplary embodiment of the DIN rail electronics rack of FIG. 8, according to a preferred embodiment of the present invention.

FIG. 12 is a perspective view illustrating an exemplary embodiment 1200 of the DIN rail electronics rack 800 of FIG. 8, according to a preferred embodiment of the present invention. Front doors 1218 and 1220 are shown in a closed position. In another embodiment, a single front door may be used. Top panel 1226 has been installed and includes knockouts 1228 (one of eleven labeled) for cable access. Rack crown 1202 has also been installed and includes a main body 1204, a removable top portion 1222 that includes a support for an illuminated acrylic logo panel 1206, an electronics compartment cover 1208, and vents 1210 (one of two labeled) and 1212 (one of two labeled). Main body 1204 is fastened to the front of the of the DIN rail electronics rack 800 using four machine screws 1224 (one of four labeled). Crown rear body 1214 provides additional connectivity to top rack frame 806. Compartment 1216, which looks like rear body 1214, may be either an additional rear body or a compartment for concealing rack door keys. Door 1218 and door 1220 are sized to adapt to the front portion of the DIN rail electronics rack 800 covered by the rack crown 1202.

Rack crown 1202 may provide one or more of the following functions: edge RGB lighting for the acrylic logo panel 1206; interior white LED rack lighting when door 1218 and/or door 1220 are opened; connectivity to rack module fault indicators and logic to illuminate a front fault indicator; configuration switches for controlling lighting, fault detection, and response to door events; RGB LED backlighting for the logo panel 1206, and a micro SD card slot for overriding the configuration switches.

Figure 13:
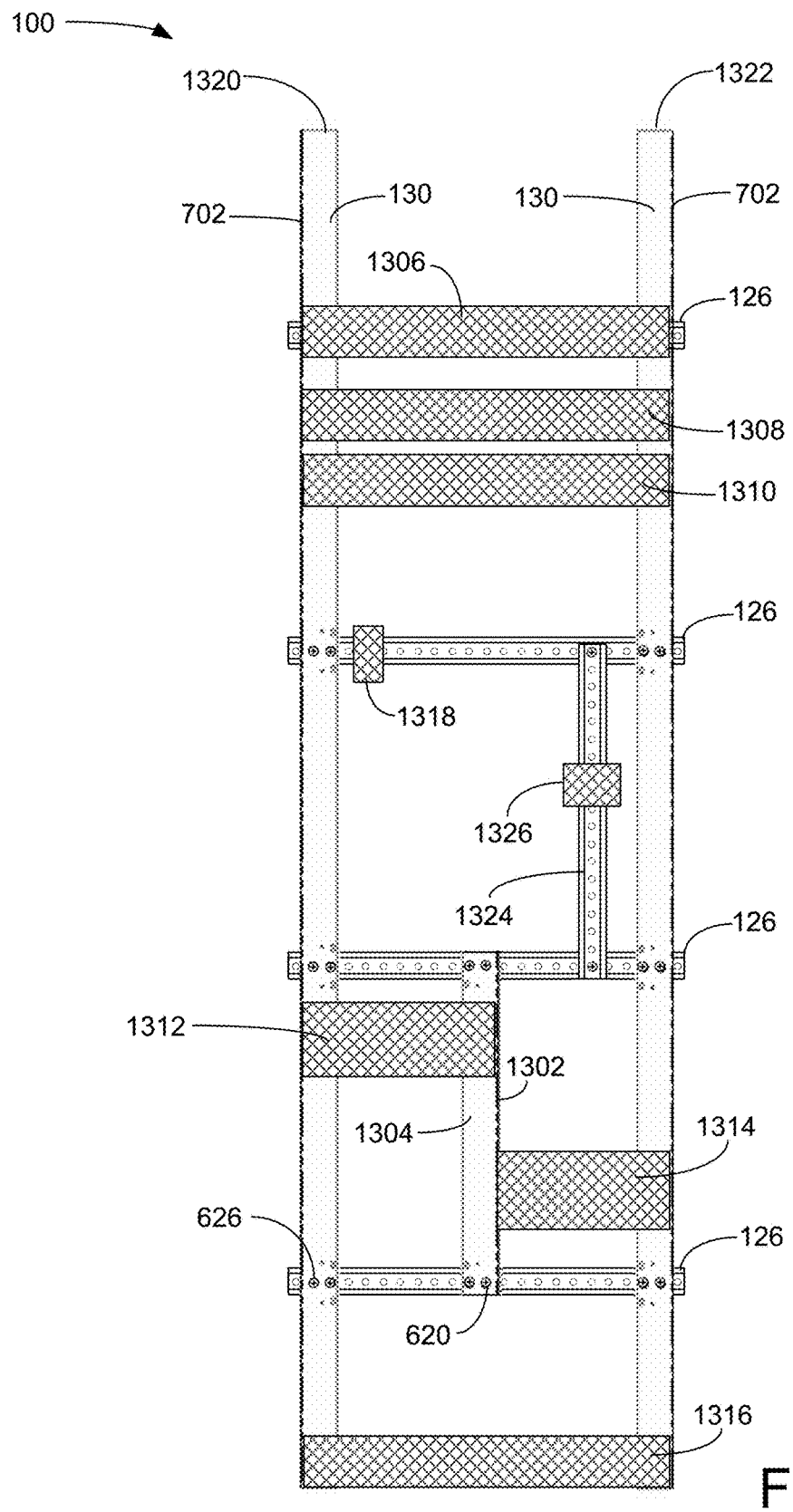
FIG. 13 is an interior side elevation diagrammatic view illustrating the exemplary embodiment of the DIN rail electronics rack of FIG. 8, according to a preferred embodiment of the present invention.

FIG. 13 is an interior side elevation diagrammatic view illustrating the exemplary embodiment of the DIN rail electronics rack 800 of FIG. 8, according to a preferred embodiment of the present invention. FIG. 13 illustrates the operational flexibility provided by the DIN rail electronics rack 800. Front equipment rail 1320 is an equipment rail identical to equipment rail 706, but is renumbered to avoid confusion between the front equipment rail 1320 and the rear equipment rail 1322, which is also identical to equipment rail 706. Electronic modules 1308, 1310, and 1316 are conventionally mounted between front and rear equipment rails 1320 and 1322, respectively. Electronic module 1306 illustrates mounting parallel to a DIN rail 126. Component 1318 illustrates conventional mounting of a small snap-on component directly on a DIN rail 126. Short equipment rail 1304 is installed between two DIN rails 126 and has a linear array of spaced-apart fastener holes (not visible in this view, but like 708) on an equipment rail attachment panel 1302. Short electronic module 1312 attaches between front equipment rail 1320 and short equipment rail 1304. Rear-facing electronics module 1314 is connected between rear equipment rail 1322 and short equipment rail 1304. Vertical DIN rail 1324 is shown connected between two horizontal DIN rails 126 and directly supporting snap-on component 1326. Those of skill in the art, enlightened by the present specification, will understand that the wide variety of rail, module, and component configurations possible within the DIN rail electronics rack 800 is a major advantage over prior art electronics racks, and are all within the scope of the present invention.

I claim:

1. A DIN rail electronics rack comprising:
   a. first and second opposed spaced-apart parallel sidewalls;
   b. at least one connecting member between said first and second sidewalls;
   c. a first plurality of DIN rails in spaced-apart array attached to an interior side of said first sidewall;
   d. a second plurality of DIN rails in spaced-apart array attached to an interior side of said second sidewall; and
   e. wherein each said DIN rail of said first and second pluralities of DIN rails comprises:
      i. a "top hat" type DIN rail, further comprising a transverse cross section having:
         1. a base;
         2. first and second parallel opposed spaced-apart sides extending orthogonally from opposing sides of said base; and
         3. first and second aligned opposed spaced apart flanges extending orthogonally outward from respective said first and second parallel opposed spaced-apart sides;
      ii. a first linear array of spaced-apart openings on said first side of said DIN rail;
      iii. a second linear array of spaced-apart openings on said second side of said DIN rail, aligned and corresponding to said first linear array of spaced-apart openings; and
      iv. a linear array of spaced-apart circular holes in said base of said DIN rail.

2. The DIN rail electronics rack of claim 1, comprising:
   a. at least two equipment rails, each further comprising:
      i. an elongated equipment rail base panel; and
      ii. an elongated equipment rail attachment panel extending at right angle from a long edge of said equipment rail base panel;
   b. at least four DIN rail clamps each configured to:
      i. be secured to said equipment rail base panel; and
      ii. clamp onto any of said DIN rails of said first and second pluralities of DIN rails.

3. The DIN rail electronics rack of claim 2, wherein each said DIN rail clamp comprises:
   a. a base having a flat under surface, an opposed upper surface, top and bottom opposed spaced-apart sides, and opposed spaced-apart left and right sides;
   b. first and second clamping flanges extending from said top and bottom sides, respectively; and
   c. a plateau extending from said base of said DIN rail clamp and having:
      i. left and right plateau sides continuous with said left and right sides of said base of said DIN rail clamp;
      ii. top and bottom sides each spaced-apart from said first and second clamping flanges, respectively;
      iii. first and second spaced-apart nut sockets in said plateau each comprising a shape to prevent rotation of a nut when said nut is being threaded during assembly;
      iv. an upper surface of said plateau surrounding each said nut socket of said first and second nut sockets; and
      v. first and second through bores through bottoms of respective said first and second nut sockets, said plateau, and said base of said DIN rail clamp.

4. The DIN rail electronics rack of claim 3, comprising first and second nuts, each further comprising:
   a. a nut-socket-engaging portion configured to fill one said nut socket of said first and second nut sockets;
   b. a panel extending from a top of said nut-socket-engaging portion comprising:
      i. top and bottom flanges comprising:
         1. lower surfaces that are configured to abut portions of said top surface of said plateau when installed; and
         2. left and right panel sides not extending over said upper surface of said plateau; and
      ii. a thickness equal to a width of an opening of said first and second linear arrays of spaced-apart openings;
   c. a nut head extending from a top of said panel comprising:
      i. a left portion extending less than one-half of an extent of said spacing between said first and second nut sockets; and
      ii. a right portion extending less than one-half of an extent of said spacing between said first and second spaced-apart nut sockets.

5. The DIN rail electronics rack of claim 4, comprises:
   a. a locking comb having three teeth, each tooth having a cross section that fits slidingly into an opening of said first and second linear arrays of spaced-apart openings; and
   b. wherein:
      i. said first and second nut heads form three channels, when installed;
      ii. said three channels are alignable to any three adjacent openings of said first and second linear arrays of spaced-apart openings;
   c. said locking comb is sized and shaped be inserted through any three adjacent openings of said first linear array of spaced-apart openings, then through said three channels, and then through three aligned adjacent openings of said second linear array of spaced-apart openings; and
   d. at least two teeth of said locking comb have a length to:
      i. extend outside of said DIN rail, when installed; and
      ii. have fastener openings for securing said at least two teeth together.

6. The DIN rail electronics rack of claim 1, wherein said first plurality of DIN rails attached to said first sidewall are parallel and aligned one-to-one to said second plurality of DIN rails attached to said second sidewall.

7. The DIN rail electronics rack of claim 1, wherein:
   a. said first plurality of DIN rails in spaced-apart array welded to an interior surface of said first sidewall; and
   b. said second plurality of DIN rails in spaced-apart array welded to an interior surface of said second sidewall.

8. The DIN rail electronics rack of claim 1, comprising a rack crown further comprising:
   a. a main body configured to be attached to a top, and to a portion of the front, of said DIN rail electronics rack;
   b. first and second rear bodies:
      i. extending rearward from said main body from opposed ends of said main body; and
      ii. attachable to a top frame of said DIN rail electronics rack;
   c. a removable top portion comprising a support for an illuminated logo panel;
   d. an electronics compartment;
   e. an electronics compartment cover; and
   f. a plurality of vents.

9. The DIN rail electronics rack of claim 8, wherein said rack crown comprises logic circuitry, electronic connectability from said logic circuitry to a fault detection output on a rack mounted electronic module, and a light source responsive to said logic circuitry to illuminate when a fault is detected.

10. The DIN rail electronics rack of claim 9, comprising at least one front door sized to accommodate said rack crown.

11. The DIN rail electronics rack of claim 9, comprising a top panel of said DIN rail electronics rack having a plurality of knockouts and sized to accommodate said rack crown.

12. A DIN rail electronics rack comprising:
   a. first and second opposed spaced-apart parallel sidewalls;
   b. at least one DIN rail mounted on an interior side of at least one of said first and second sidewalls
   c. wherein each said DIN rail of said at least one DIN rail comprises:
      i. a "top hat" type DIN rail, further comprising a transverse cross section having:
         1. a base;
         2. first and second parallel opposed spaced-apart sides extending orthogonally from opposing sides of said base; and
         3. first and second aligned opposed spaced apart flanges extending orthogonally outward from respective said first and second parallel opposed spaced-apart sides;
      ii. a first linear array of spaced-apart openings on said first side of said DIN rail; and
      iii. a second linear array of spaced-apart openings on said second opposed side of said DIN rail, aligned and corresponding to said first linear array of spaced-apart openings.

13. The DIN rail electronics rack of claim 12, comprising:
   a. a first plurality of said DIN rails in spaced-apart array attached to an interior side of said first sidewall;
   b. a second plurality of said DIN rails in spaced-apart array attached to an interior side of said second sidewall;
   c. at least two equipment rails, each further comprising:
      i. an elongated equipment rail base panel; and
      ii. an elongated equipment rail attachment panel extending at right angle from a long edge of said equipment rail base panel;
   d. at least four DIN rail clamps each configured to:
      i. be secured to said equipment rail base panel; and
      ii. clamp onto any of said DIN rails of said first and second pluralities of DIN rails.

14. The DIN rail electronics rack of claim 13, wherein each said DIN rail clamp comprises:
   a. a base having a flat under surface, an opposed upper surface, top and bottom opposed spaced-apart sides, and opposed spaced-apart left and right sides;
   b. first and second clamping flanges extending from said top and bottom sides, respectively; and
   c. a plateau extending from said base of said DIN rail clamp and having:
      i. left and right plateau sides continuous with said left and right sides of said base of said DIN rail clamp;
      ii. top and bottom sides each spaced-apart from said first and second clamping flanges, respectively;
      iii. first and second spaced-apart nut sockets in said plateau each comprising a shape to prevent rotation of a nut when said nut is being threaded during assembly;
      iv. an upper surface of said plateau surrounding each said nut socket of said first and second nut sockets; and
      v. first and second through bores through bottoms of respective said first and second nut sockets, said plateau, and said base of said DIN rail clamp;
   d. first and second nuts, each further comprising:
      i. a nut-socket-engaging portion configured to fill one said nut socket of said first and second nut sockets;
      ii. a panel extending from a top of said socket-engaging portion comprising:
         1. top and bottom flanges comprising:
            a. lower surfaces that are configured to abut portions of said top surface of said plateau when installed; and
            b. left and right panel sides spaced-apart from said left and right plateau sides; and
         2. a thickness equal to a width of an opening of said first and second linear arrays of spaced-apart openings;
      iii. a nut head extending from a top of said panel comprising:
         1. a left portion extending less than one-half of a spacing of said first and second nut sockets; and
         2. a right portion extending less than one-half of an extent of a spacing of said first and second spaced-apart nut sockets;
   e. a locking comb having three teeth, each tooth having a cross section that fits slidingly into an opening of said first and second linear arrays of spaced-apart openings; and
   f. wherein:
      i. said first and second nut heads form three channels, when installed;
      ii. said three channels are alignable to any three adjacent openings of said first and second linear arrays of spaced-apart openings;
   g. said locking comb is sized and shaped be inserted through any three adjacent openings of said first linear array of spaced-apart openings, then through said three channels, and then through three aligned adjacent openings of said second linear array of spaced-apart openings; and h. at least two teeth of said locking comb have a length to:
   i. extend outside of said DIN rail, when installed; and
   ii. have fastener openings for securing said at least two teeth together outside of said DIN rail.

15. The DIN rail electronics rack of claim 12, comprising a rack crown further comprising:
  a. a main body configured to be attached to a top, and to a portion of the front, of said DIN rail electronics rack;
  b. first and second rear bodies:
    i. extending rearward from said main body from opposed ends of said main body; and
    ii. attachable to a top frame of said DIN rail electronics rack;
  c. a removable top portion comprising a support for an illuminated acrylic logo panel;
  d. an electronics compartment cover;
  e. a plurality of vents;
  f. logic circuitry;
  g. communication between said logic circuitry and a fault detection output on a rack mounted electronic module; and
  h. a light source responsive to said logic circuitry to illuminate when a fault is detected.

16. The DIN rail electronics rack of claim 15, comprising at least two of:
  a. at least one front door sized to accommodate said rack crown;
  b. at least one rear door; and
  c. a top panel of said DIN rail electronics rack having a plurality of knockouts and sized to accommodate said rack crown.

17. A DIN rail electronics rack comprising:
  a. an electronics rack having a sidewall;
  b. a DIN rail attached to said sidewall;
  c. a DIN rail clamp:
    i. adapted to clamp resiliently onto said DIN rail; and
    ii. attached to an equipment attachment rail; and
  d. wherein said DIN rail comprises:
    i. a "top hat" type DIN rail, further comprising a transverse cross section having:
      1. a base;
      2. first and second parallel opposed spaced-apart sides extending orthogonally from opposing sides of said base; and
      3. first and second aligned opposed spaced apart flanges extending orthogonally outward from respective said first and second parallel opposed spaced-apart sides;
    ii. a first linear array of spaced-apart openings on said first side of said DIN rail;
    iii. a second linear array of spaced-apart openings on said second side of said DIN rail, aligned and corresponding to said first linear array of spaced-apart openings; and
    iv. weldable areas on said base of said DIN rail.

18. The DIN rail electronics rack of claim 17, comprising:
  a. a first plurality of said DIN rails in spaced-apart array attached to an interior side of said first sidewall;
  b. a second plurality of said DIN rails in spaced-apart array attached to an interior side of said second sidewall;
  c. at least two equipment rails, each further comprising:
    i. an elongated equipment rail base panel; and
    ii. an elongated equipment rail attachment panel extending at right angle from a long edge of said equipment rail base panel;
  d. at least four DIN rail clamps each configured to:
    i. be secured to said equipment rail base panel; and
    ii. clamp onto any of said DIN rails of said first and second pluralities of DIN rails.

19. The DIN rail electronics rack of claim 18, wherein each said DIN rail clamp comprises:
  a. a base having a flat under surface, an opposed upper surface, top and bottom opposed spaced-apart sides, and opposed spaced-apart left and right sides;
  b. first and second clamping flanges extending from said top and bottom sides, respectively; and
  c. a plateau extending from said base and having:
    i. left and right plateau sides continuous with said left and right sides of said base;
    ii. top and bottom sides each spaced-apart from said first and second clamping flanges, respectively;
    iii. first and second spaced-apart nut sockets in said plateau each comprising a shape to prevent rotation of a nut when said nut is being threaded during assembly;
    iv. an upper surface of said plateau surrounding each said nut socket of said first and second nut sockets; and
    v. first and second through bores through bottoms of respective said first and second nut sockets, said plateau, and said base;
  d. first and second nuts, each further comprising:
    i. a nut-socket-engaging portion configured to fill one said nut socket of said first and second nut sockets;
    ii. a panel extending from a top of said nut-socket-engaging portion comprising:
      1. top and bottom flanges comprising:
        a. lower surfaces that are configured to abut portions of said top surface of said plateau when installed; and
        b. left and right panel sides spaced-apart from said left and right plateau sides; and
      2. a thickness equal to a width of an opening of said first and second linear arrays of spaced-apart rectangular openings;
    iii. a nut head extending from a top of said panel comprising:
      1. a left portion extending less than one-half of said spacing between said first and second nut sockets; and
      2. a right portion extending less than one-half of an extent of said spacing of said first and second spaced-apart nut sockets;
  e. a locking comb having three teeth, each said tooth having a cross section that fits slidingly into an opening of said first and second linear arrays of spaced-apart openings; and
  f. wherein:
    i. said first and second nut heads form three channels, when installed;
    ii. said three channels are alignable to any three adjacent openings of said first and second linear arrays of spaced-apart openings;
  g. said locking comb is sized and shaped be inserted through any three adjacent openings of said first linear array of spaced-apart openings, then through said three channels, and then through three aligned adjacent openings of said second linear array of spaced-apart openings; and
  h. at least two teeth of said locking comb have a length to:
    i. extend outside of said DIN rail, when installed; and
    ii. have fastener openings for securing said at least two teeth together.

20. The DIN rail electronics rack of claim 17, comprising a rack crown further comprising:
   a. a main body configured to be attached to a top, and to a portion of the front, of said DIN rail electronics rack;
   b. first and second rear bodies:
      i. extending rearward from said main body from opposed ends of said main body; and
      ii. attachable to a top frame of said DIN rail electronics rack;
   c. a removable top portion comprising a support for an illuminated logo panel;
   d. an electronics compartment;
   e. and electronics compartment cover;
   f. a plurality of vents;
   g. logic circuitry;
   h. communication between said logic circuitry and a fault detection output on a rack mounted electronic module; and
   i. a light source responsive to said logic circuitry to illuminate when a fault is detected.

* * * * *